United States Patent
Myer

[11] Patent Number: 6,157,254
[45] Date of Patent: Dec. 5, 2000

[54] DOUBLE SIDE BAND PILOT TECHNIQUE FOR A CONTROL SYSTEM THAT REDUCES DISTORTION PRODUCED BY ELECTRICAL CIRCUITS

[75] Inventor: Robert Evan Myer, Denville, N.J.

[73] Assignee: Lucent Technologies Inc., Murray Hill, N.J.

[21] Appl. No.: 09/162,553

[22] Filed: Sep. 29, 1998

[51] Int. Cl.[7] .................................................. H03F 3/66
[52] U.S. Cl. .............................................. 330/52; 330/151
[58] Field of Search ............................... 330/52, 149, 151

[56] References Cited

U.S. PATENT DOCUMENTS

| | | | |
|---|---|---|---|
| 5,796,304 | 8/1998 | Gentzler | 330/52 |
| 5,815,036 | 9/1998 | Yoshikawa et al. | 330/52 |
| 5,926,067 | 7/1999 | Myer et al. | 330/52 |
| 5,986,499 | 11/1999 | Myer | 330/52 |

*Primary Examiner*—Steven J. Mottola
*Attorney, Agent, or Firm*—Claude R. Narcisse

[57] ABSTRACT

A control system comprising an electrical circuit that produces distortion where the electrical circuit has a frequency band of operation. Double side band pilot signals are located slightly outside the boundaries of the frequency band of operation so as not to interfere with any signals within the frequency band of operation, but still provide information that the control system uses to substantially cancel the distortion.

9 Claims, 3 Drawing Sheets

DOUBLE SIDE BAND PILOT TECHNIQUE FOR A CONTROL SYSTEM THAT REDUCES DISTORTION PRODUCED BY ELECTRICAL CIRCUITS

BACKGROUND OF THE INVENTION

1. Field of the Invention

The present invention is directed to a control system comprising an electrical circuit that uses a pilot signal to substantially cancel distortion produced by the electrical circuit and more particularly to a technique of applying a double side band pilot signal at the edges of the band of operation of the electrical circuit.

2. Description of the Related Art

Electrical signals when applied to electrical circuits are often distorted as a result of being processed by the circuits. Also electrical circuits generate signals for various useful purposes. The distortion comprises any undesired signals produced by the electrical circuits which are added to or are somehow combined with the applied or generated signals. A well known technique for substantially canceling distortion produced by an electrical circuit uses a control system coupled to the electrical circuit to which a pilot signal is applied. The applied pilot signal is detected by the control system. The applied pilot signal can have a single spectral component (i.e., one frequency) of a certain amplitude or the applied pilot signal can comprise a plurality of spectral components of various amplitudes. Typically, the applied pilot signal has an amplitude that is at least 60 dB lower than signals applied to or generated by the electrical circuit. The control system obtains information (about the distortion) from the detected pilot signal and uses that information to substantially cancel the distortion produced by the electrical circuit.

A control system comprises at least one circuit which uses external signals or signals generated by the at least one circuit to process signals applied to the at least one circuit. A particular implementation of the technique discussed above is shown in FIG. 1. FIG. 1 depicts a control system, comprising two feed forward loops (loop 1 and loop 2) and detection circuit 132. A pilot signal is applied to electrical circuit 108 via coupler 105. Electrical circuit 108 can be any electrical and/or electronic (e.g., Radio Frequency (RF) linear amplifier, power amplifier) circuit. Loop I comprises coupler 105, Gain & Phase circuit 104, splitter 102 and delay circuit 126. Coupler 105 is typically a device which combines two or more input signals and allows access to all or a portion of the combined signal. A coupler is also used to obtain a portion of a signal appearing at its input and output. Gain & Phase circuit 104 is typically a circuit which modifies the amplitude and phase of signals applied to its input based on the values of control signals applied to its control inputs (not shown). Splitter 102 is a circuit with one input and at least two outputs where a signal applied to the input is substantially replicated at the outputs. Delay circuit 126 is typically a circuit which applies a certain amount of delay to a signal applied to its input.

When a signal is applied to the input of the control system (i.e., to splitter 102), the distortion experienced by the applied signal due to electrical circuit 108 is isolated at point A (i.e., path 123). In particular, an input signal is applied to splitter 102. Splitter 102 substantially replicates the input signal on paths 103 and 127. In path 103 the input signal is applied to Gain & Phase circuit 104, coupler 105 and electrical circuit 108. In path 127, the input signal is delayed by delay circuit 126 and then fed to cancellation circuit 124 via path 125. Although not shown, it will be readily understood to those skilled in the art that the amplitude and phase of the input signal on path 125 can be detected (using well known detection circuitry) and converted to control signals that are applied to the control inputs (not shown) of Gain and Phase circuit 104. Using coupler 112, a portion of the input signal (plus any distortion produced by electrical circuit 108) appearing at the output of electrical circuit 108 is fed to cancellation circuit 124 via path 113. Cancellation circuit 124 can be implemented as a combiner circuit which has at least two inputs and one output. A combiner circuit combines signals applied to its inputs and transfers the combined signal to its output. Gain and Phase circuit 104 is adjusted such that the amplitude and phase of the input signal on path 113 are modified resulting in that signal being substantially 180° out of phase (+/−1°) and relatively the same amplitude (i.e., substantially the inverse) with the input signal on path 125 such that when the two signals are combined by cancellation circuit 124 they substantially cancel each other leaving the distortion (produced by electrical circuit 108) at point A (path 123). Thus Loop 1 is designed to isolate the distortion produced by electrical circuit 108.

Loop 2, which comprises delay circuit 114, coupler 116, Gain & Phase circuit 122, and amplifier 120, is designed to use information obtained by Detection circuit 132 from a pilot signal applied to electrical circuit 108 to substantially cancel the distortion produced by electrical circuit 108. In particular, a pilot signal is applied to electrical circuit 108 via coupler 105. The pilot signal (processed by electrical circuit 108) appears on path 115 and at the output of coupler 116, i.e., on path 117. The pilot signal also appears at point A on path 123 after having propagated through path 113 via coupler 112. A portion of the pilot signal processed by electrical circuit 108 is fed to detection circuit 132 via coupler 130 and path 128. Detection circuit 132 comprises well known circuits (e.g., Log detector/amplifier, Sample & Hold circuit, Null circuit) to detect signal characteristics (e.g., amplitude) of the pilot signal. Some or all of the characteristics may have been altered due to the distortion effects of electrical circuit 108. Detection circuit 132 detects the characteristics of the input and uses this information to generate control signals on path 131 to cause Gain & Phase circuit 122 to modify the pilot signal. The pilot signal at point A is modified such that the pilot signal appearing on path 118 is substantially the inverse (relatively same amplitude, 180° out of phase, +/−1°) of the pilot signal appearing on path 115. Amplifier 120 provides additional gain to the output of Gain & Phase circuit 122. The additional gain is calculated such that the signal appearing on path 118 has an amplitude substantially equal to the amplitude of the signal on path 115. Delay circuit 114 is designed such that the two pilot signals arrive at coupler 116 at substantially the same moment; that is, the two pilot signals are substantially synchronized (aligned in time) to each other. When the two pilot signals are combined by coupler 116 they cancel each other.

Detection circuit 132 now has the information that allows Gain & Phase circuit 122 to modify distortion appearing at point A and thus cancel distortion appearing at the output of electrical circuit 108. When an input signal is applied to the control system, any distortion produced by electrical circuit 108 is isolated at point A (on path 123) as discussed above. The signal on path 115 is the input signal (processed by electrical circuit 108) plus any distortion produced by electrical circuit 108. The distortion at point A is modified by Gain and Phase circuit 122 based on the information (i.e., signal characteristics) obtained from the previously applied pilot signal so that the distortion on path 129 is substantially the inverse of the distortion on path 115. The distortions on path 115 and path 118 are combined at coupler 116 causing the distortions to substantially cancel each other resulting in an output signal that is substantially free of distortion.

Electrical circuit 108 has a bandwidth that defines a frequency band of operation. It is desirable that the pilot signal be spectrally located substantially in the middle of the frequency band of operation of electrical circuit 108 because the distortion experienced by such a pilot signal tends to be substantially similar to the distortion experienced by a signal applied to or generated by electrical circuit 108. However, placing the pilot signal anywhere in the band of operation of electrical circuit 108 causes interference to occur between the input signal and the pilot signal adding more distortion to the input signal. The interference is any interaction between the pilot signal and an applied or generated signal that adversely affects one or more characteristic (e.g., amplitude, frequency, phase) of the applied or generated signal and/or the pilot signal. Thus, interference not only distorts any signal that is applied or generated by the electrical circuit, but also affects the pilot signal. As discussed above, the pilot signal is typically 60 dB below the amplitude of applied or generated signals and thus would be interfered with by such signals. A distorted pilot signal provides inaccurate information about the distortion and thus the very purpose of such a pilot signal is defeated. Also, even when the pilot signal is located in the middle of the frequency band of operation, it does not experience the distortions located in other parts (e.g., lower band or upper band) of the frequency band of operation. What is therefore needed is to use a pilot signal that obtains information about the entire frequency band of operation of the electrical circuit and does so without interfering with any signals applied to or generated by the electrical circuit.

SUMMARY OF THE INVENTION

The present invention is a control system comprising an electrical circuit that produces distortion where the electrical circuit has a frequency band of operation. The side bands of a carrier signal spectrally located proximate to the boundaries of the frequency band of operation are used as pilot signals and are applied to the electrical circuit. Information about the distortion is obtained from the side band pilot signals which do not interfere with any signal applied to or generated within the frequency band of operation of the electrical circuit. The information obtained is used by the control system to substantially cancel the distortion produced by the electrical circuit.

The control system of the present invention also comprises a first feed forward loop and a second feed forward loop coupled to the electrical circuit. The control system of the present invention further comprises a Carrier circuit coupled to a Double Side Band (DSB) modulator which is coupled to the electrical circuit. The control system of the present invention still further comprises a Detection circuit coupled to the carrier circuit and the second feed forward loop. The Carrier circuit is configured to generate a carrier signal. The DSB modulator is configured to generate side band pilot signals spectrally located outside the band of operation of the electrical circuit. In a preferred embodiment of the present invention, the side band pilot signals are created from a carrier having a center frequency corresponding to the center frequency of the electrical circuit modulated by a signal whose frequency component is equal to more than half the bandwidth of the electrical circuit. The Detection circuit obtains information about the distortion produced by the electrical circuit from the side band pilot signals and provides the information to the second feed forward loop. The first feed forward loop is configured to isolate the distortion produced by the electrical circuit. The second feed forward loop is configured to use the information obtained by the Detection circuit to substantially cancel the distortion produced by the electrical circuit.

DETAILED DESCRIPTION

Figure 1:
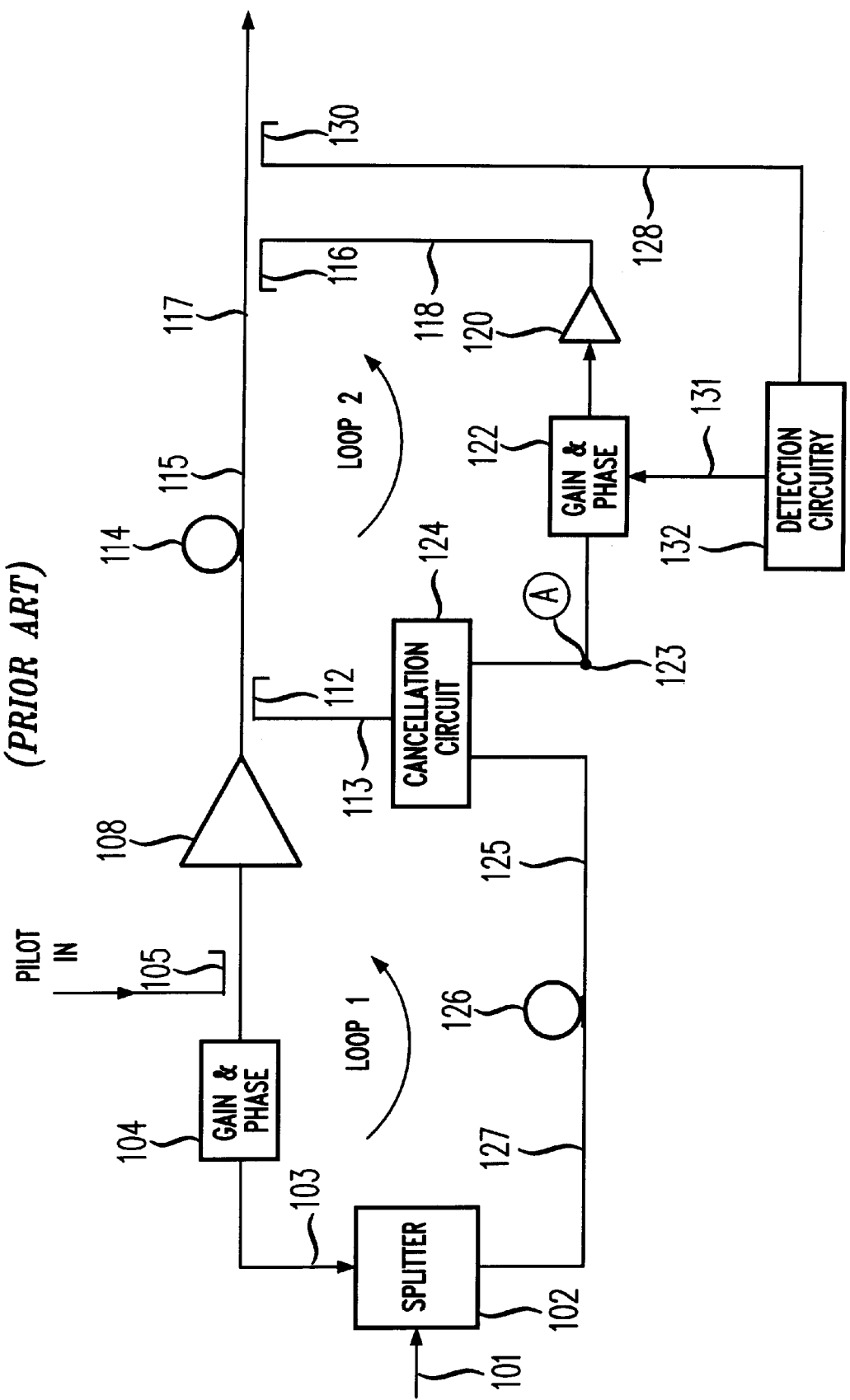
FIG. 1 depicts a control system comprising two feed forward loops and detection circuitry.
Figure 2:
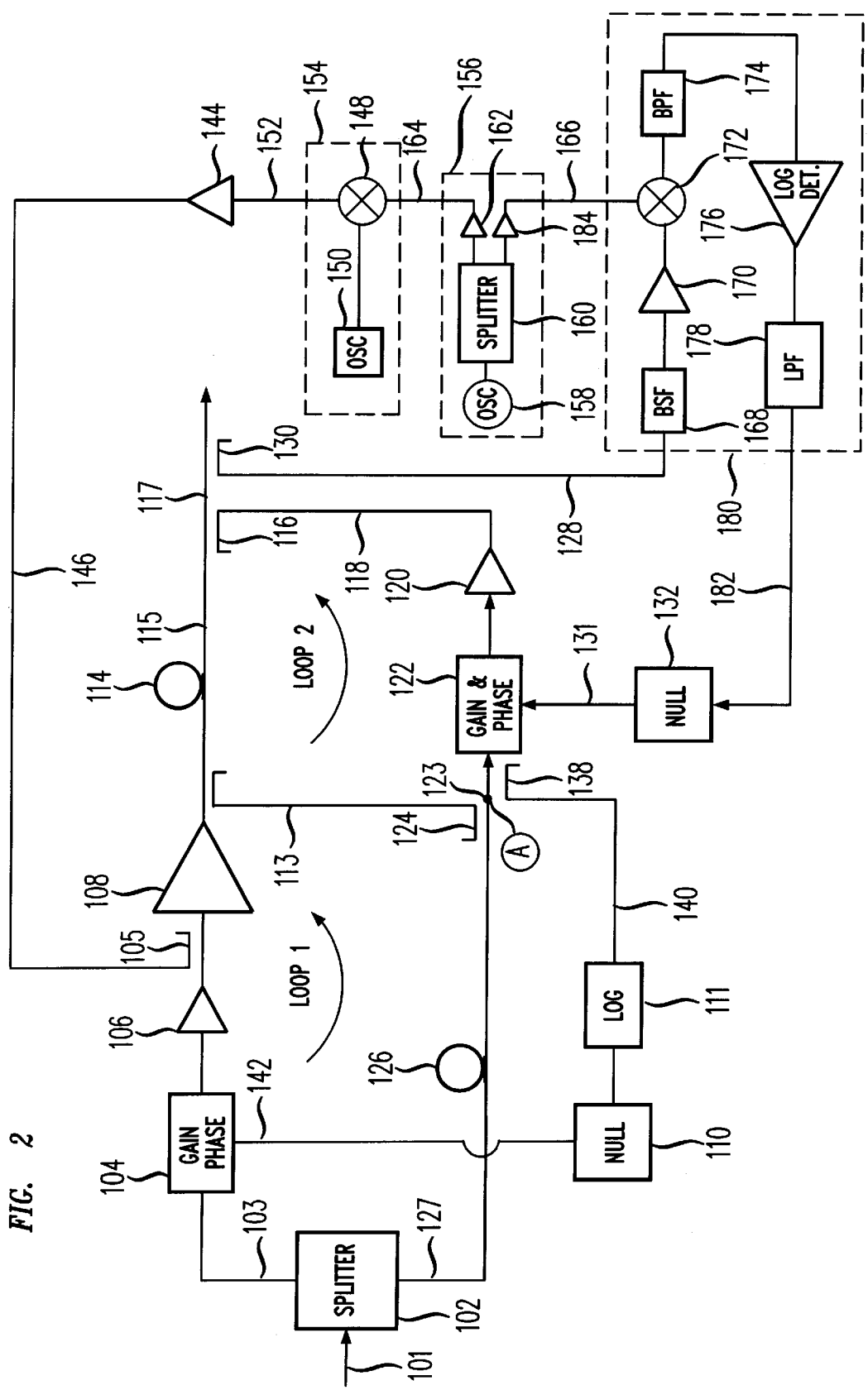
FIG. 2 depicts a control system of the present invention.

Referring to FIG. 2, there is shown a control system of the present invention comprising electrical circuit 108 coupled to a first feed forward loop (i.e., loop 1) and a second feed forward loop (i.e., loop 2). The control system of the present invention further comprises Carrier circuit 156 coupled to Double Side Band (DSB) modulator 154 and to Detection circuit 180. Electrical circuit 108 produces distortion which is isolated at point A by loop 1. Loop 2 uses information obtained from Detection circuit 180 to cancel the distortion produced by electrical circuit 108. The information obtained by Detection circuit 180 is gleaned from double side band pilot signals (i.e., two pilot signals) applied to electrical circuit 108 (via path 146 and coupler 105) with the use of carrier circuit 156 and DSB modulator 154. Carrier circuit 156 along with DSB modulator 154 generate the pilot signals from which Detection circuit 180 obtains information. The pilot signals are spectrally located outside of the frequency band of operation of electrical circuit 108 and thus do not to interfere with any signal applied or generated within the frequency band of electrical circuit 108. In one preferred embodiment, the pilot side bands are created by modulating a carrier whose frequency is equal to the center frequency of the bandwidth of electrical circuit 108 with a signal whose frequency is equal to more than half the bandwidth of electrical circuit 108.

Figure 3:
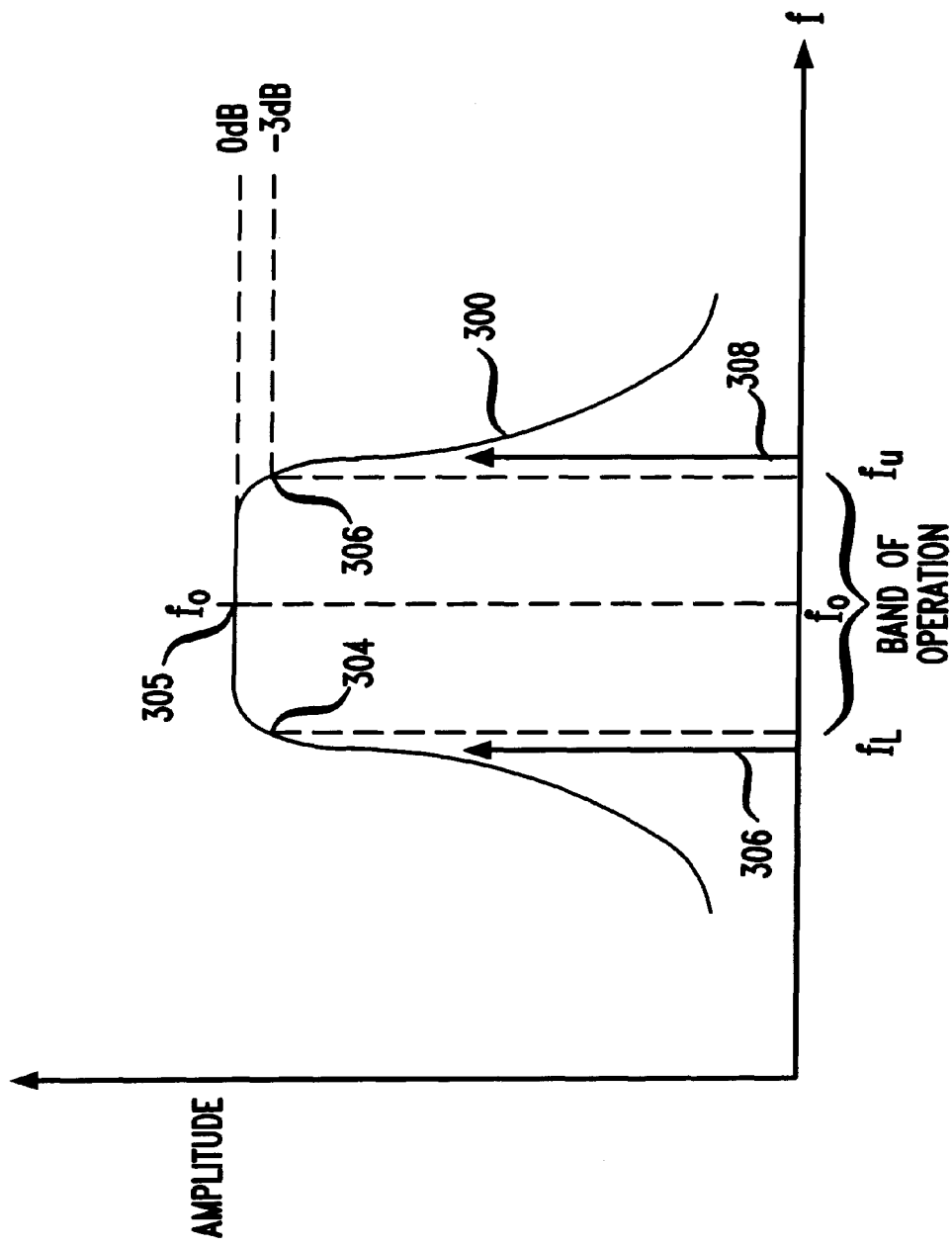
FIG. 3 depicts the frequency response of the electrical circuit of the control system of the present invention with a double side band pilot signals located proximate to the boundaries of the band of operation of the electrical circuit.

Referring to FIG. 3, there is shown a frequency response (300) of electrical circuit 108 with side bands 306 and 308 representing the pilot signals. The frequency response is a chart or graph showing how a particular characteristic (e.g., amplitude, phase) of an electrical circuit corresponds with frequency. It should be noted that the particular frequency response shown is for illustrative purposes only and that electrical circuit 108 is not limited to frequency response 300. The frequency band of operation is a range of frequencies within which electrical circuit 108 processes and/or generates signals. The boundaries of the frequency band of operation are defined by lower frequency $f_L$ and upper frequency $f_U$. Frequencies $f_L$ and $f_U$ correspond to the points (304, 306) at which the frequency response is 3 dB below its maximum amplitude response (0 dB). Typically the bandwidth of a circuit is defined by the frequencies that correspond to its 3 dB points. The frequency band of operation need not be the bandwidth. Frequency $f_0$ is defined as the center frequency of the bandwidth of electrical circuit 108. The center frequency is typically located symmetrically with respect to the 3 dB frequencies, i.e., $f_0-f_L=f_U-f_0$. Side band pilot signals 306 and 308 can be located at the 3dB frequencies or preferably, as shown in FIG. 3, proximate to the 3 db frequencies but outside of the bandwidth of electrical circuit 108. More generally, the side band pilot signals are preferably located outside the frequency band of operation but proximate to the boundaries of the frequency band of operation. Proximate location of the side band pilot signals is defined as frequencies about the frequency band of operation which allow the pilot signals to provide information that are used to substantially cancel the distortion produced by electrical circuit 108.

Referring again to FIG. 2, Carrier circuit 156 comprises Oscillator 158 coupled to Splitter 160. Each of the outputs of Splitter 160 is coupled to an amplifier (162, 184). One of the outputs is applied to Mixer 172 of Detection circuit 180 and the other output is applied to DSB modulator 154.

DSB modulator 154 is a well known circuit shown here comprising Oscillator 150 and mixer 148. Oscillator 150 generates a modulating signal (i.e., a sinusoid) of a certain frequency preferably equal to more than half the bandwidth of electrical circuit 108. The output of Oscillator 150 is coupled to one input of mixer 148. The other input of mixer 148 is coupled to an output of Carrier circuit 156. Carrier circuit 156 comprises oscillator 158 coupled to splitter 160 having two outputs each of which is connected to an amplifier (162, 184). Oscillator 158 of Carrier circuit 156 generates a carrier whose frequency is preferably equal to the center frequency ($f_0$) of the bandwidth of electrical circuit 108. The output of DSB modulator 154 is the carrier signal modulated with the modulating signal which results in two signals commonly referred to as side bands. The frequency of one side band is equal to the sum of the carrier frequency and the modulating frequency. The frequency of the other side band is equal to the difference of the carrier frequency and the modulating frequency. Therefore, when the carrier frequency is $f_0$ and the frequency of the modulating signal is equal to slightly more than half the bandwidth of electrical circuit 108 then the side bands are located proximate to the 3 dB frequencies ($f_L$, $f_U$) of electrical circuit 108. The modulating frequency can be selected to be any frequency and thus the side bands can be located within or without the frequency band of operation. Preferably, the frequency of the modulating signal is selected such that the side bands are located outside the bandwidth but proximate to the 3 dB frequencies or outside of the frequency band of operation of electrical circuit 108 but proximate to the boundaries of the frequency band of operation.

The side bands are used as pilot signals which are applied to electrical circuit 108 via amplifier 144, path 146 and coupler 105. The pilot signals appear on path 117 and portions of the pilot signals are coupled to path 128 via coupler 130 and applied to Detection circuit 180. Detection circuit 180 comprises BSF 168 coupled to amplifier 170 coupled to Mixer 172 which is coupled BPF 174. Detection circuit 180 further comprises Log Detector 176 coupled to BPF 174 and to LPF 178. The pilot modulated carrier signal is applied to Band Stop Filter (BSF) 168 of Detection circuit 180. BSF 168 is a filter circuit that rejects or significantly attenuates signals having certain frequencies and does not affect all other signals. BSF 168 is designed to reject any signal falling within the band of operation of electrical circuit 108. The pilot signals are then applied to Mixer 172 via amplifier 170. An output of carrier circuit 156 is also applied to Mixer 172. Mixer 172 is a well known circuit having at least two inputs and at least one output where the output is the result of the two input signals being multiplied to each other. It is well known that when two signals having certain frequencies are mixed, the result are signals comprising frequencies which are the sum and difference of the frequencies of the two signals. The mixing of two signals having the same frequencies is known as synchronous detection. Therefore, the pilot signals are synchronously detected by Mixer 172 and the output of Mixer 172 is fed to BPF 174 whose center frequency is equal to the frequency of Oscillator 150. The output of BPF 174 is therefore the pilot signal.

The pilot signal is applied to Log Detector 176 which detects a characteristic (e.g., amplitude) of the pilot signal and converts said characteristic to a voltage. The output of Log Detector 176 is applied to Low Pass Filter (LPF) 178. LPF 178 acts as an averaging circuit and generates an average of a characteristic (e.g., amplitude) of the detected pilot signal which contains information about the distortion experienced by the pilot signal. The average is applied to Null circuit 132 via path 136. Null circuit 132 generates a control signal to Gain & Phase circuit 122 via path 131. The control signals generated by Null circuit 132 cause Gain & Phase amplifier 122 to modify the distortion at point A such that it is canceled with distortion appearing on path 115 with the use of coupler 116.

I claim:

1. A control system comprising an electrical circuit that produces distortion and has a band of operation defined by boundaries, a first feedforward loop coupled to the electrical circuit where the first feedforward loop isolates the distortion, a second feedforward loop coupled to the first feedforward, the control system further comprising:

a double side band modulator coupled to an input of the electrical circuit and the second feedforward loop where the double side band modulator generates side band pilot signals which are applied to the input of the electrical circuit and are spectrally located outside the band of operation of the electrical circuit allowing information to be obtained about the distortion which information is used by the second feedforward loop to substantially cancel the distortion.

2. The control system of claim 1 where the side band pilot signals are located outside the band of operation and proximate the boundaries of the electrical circuit.

3. The control system of claim 1 where the side band pilot signals are spectrally located within the band of operation and proximate the boundaries of the electrical circuit.

4. The control system of claim 1 where the electrical circuit has a band of operation which is equal to its bandwidth and where the side band pilot signals are spectrally located within or without the bandwidth.

5. The control system of claim 4 where the side band pilot signals are located proximate the boundaries of the bandwidth.

6. The control system of claim 1 further comprising a detection circuit coupled to the double side band modulator and the second feedforward loop where the detection circuit obtains information from the double side band pilot signals applied to the electrical circuit and provides that information to the second feedforward loop.

7. The control system of claim 1 where the double side band modulator comprises an oscillator coupled to a mixer having a first input and a second input whereby the first input is coupled to the oscillator and the second input is coupled to a carrier circuit.

8. The control system of claim 7 where the band of operation of the electrical circuit has a center frequency and the carrier circuit comprises an oscillator coupled to a splitter which is coupled to the mixer of the double side band modulator whereby the oscillator of the carrier circuit generates a sinusoid having a frequency equal to the center frequency of the electrical circuit and the oscillator of the double side band modulator generates a modulating sinusoid whose frequency is such that when the sinusoids are mixed by the mixer of the double side band modulator the resulting side band pilot signals are spectrally located outside of the band of operation and proximate the boundaries of the electrical circuit.

9. The control system of claim 8 where the resulting side band pilot signals are spectrally located within the band of operation and proximate the boundaries of the electrical circuit.

\* \* \* \* \*